(12) United States Patent
Kim

(10) Patent No.: US 10,490,610 B2
(45) Date of Patent: Nov. 26, 2019

(54) DISPLAY DEVICE

(71) Applicant: LG Display Co., Ltd., Seoul (KR)

(72) Inventor: Jong-Sung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/660,764

(22) Filed: Jul. 26, 2017

(65) Prior Publication Data

US 2018/0182818 A1 Jun. 28, 2018

(30) Foreign Application Priority Data

Dec. 28, 2016 (KR) .......................... 10-2016-0181125

(51) Int. Cl.
*H01L 27/32* (2006.01)
*G06F 3/044* (2006.01)
*H01L 51/52* (2006.01)

(52) U.S. Cl.
CPC ............ *H01L 27/323* (2013.01); *G06F 3/044* (2013.01); *H01L 27/322* (2013.01); *H01L 27/3246* (2013.01); *H01L 27/3258* (2013.01); *H01L 27/3276* (2013.01); *H01L 51/5256* (2013.01); *H01L 51/5284* (2013.01); *G06F 2203/04103* (2013.01); *G06F 2203/04111* (2013.01); *G06F 2203/04112* (2013.01); *H01L 27/3248* (2013.01)

(58) Field of Classification Search
CPC ........... G06F 3/044; G06F 2203/04112; G06F 2203/04111; G06F 2203/04103; G06F 3/0412; G06F 3/0416; H01L 27/323; H01L 51/5256; H01L 27/322; H01L 51/5284; H01L 27/3276; H01L 27/3246; H01L 27/3258; H01L 27/3248; H01L 51/5253
See application file for complete search history.

(56) References Cited

U.S. PATENT DOCUMENTS 8,581,123 B2 11/2013 Ozeki et al.
9,960,213 B2 5/2018 Senda et al.
2008/0211394 A1* 9/2008 Koshihara ............... G06F 3/044
                                                                  313/504

(Continued)

FOREIGN PATENT DOCUMENTS

JP  2012-079134 A  4/2012
JP  2014-038582 A  2/2014

(Continued)

OTHER PUBLICATIONS

Japan Patent Office, Notice of Reasons for Rejection, JP Patent Application No. 2017-237747, dated Oct. 30, 2018, 11 pages.

(Continued)

*Primary Examiner* — Carolyn R Edwards
(74) *Attorney, Agent, or Firm* — Fenwick & West LLP

(57) ABSTRACT

A thin and lightweight display device is disclosed. An organic light-emitting display device having a touch sensor is configured such that a color filter array, which is disposed between an encapsulation unit and the touch sensor, extends to a pad area to contact the touch pad, thereby reducing stress on the pad area, and such that touch electrodes are disposed on the encapsulation unit, with the result that an additional bonding process is not required, whereby the process is simplified and cost is reduced.

21 Claims, 15 Drawing Sheets

(56) References Cited

U.S. PATENT DOCUMENTS

| | | | |
|---|---|---|---|
| 2010/0097296 A1* | 4/2010 | Wang | H01L 27/322 345/32 |
| 2010/0134426 A1* | 6/2010 | Lee | G06F 3/0412 345/173 |
| 2012/0081333 A1 | 4/2012 | Ozeki et al. | |
| 2013/0135540 A1* | 5/2013 | Nam | G02F 1/136286 349/12 |
| 2014/0014960 A1* | 1/2014 | Yamazaki | G06F 3/0412 257/59 |
| 2014/0049484 A1 | 2/2014 | Ra | |
| 2014/0145979 A1* | 5/2014 | Lee | G06F 3/0412 345/173 |
| 2014/0183478 A1* | 7/2014 | Lee | H01L 51/56 257/40 |
| 2014/0313435 A1* | 10/2014 | Cho | H01J 9/20 349/12 |
| 2015/0311260 A1 | 10/2015 | Senda et al. | |
| 2015/0346866 A1 | 12/2015 | Kusunoki et al. | |
| 2016/0043336 A1 | 2/2016 | Kim et al. | |
| 2016/0103537 A1 | 4/2016 | Park et al. | |
| 2016/0293870 A1 | 10/2016 | Nakagawa | |
| 2016/0306472 A1* | 10/2016 | Park | G06F 3/0412 |
| 2016/0307971 A1 | 10/2016 | Jeon | |
| 2016/0365027 A1 | 12/2016 | Suh | |
| 2017/0176787 A1* | 6/2017 | Jia | G02F 1/1336 |
| 2017/0179432 A1* | 6/2017 | Visweswaran | H01L 51/5256 |
| 2018/0032189 A1* | 2/2018 | Lee | G06F 3/0412 |
| 2018/0033832 A1* | 2/2018 | Park | G06F 1/1652 |
| 2018/0039360 A1* | 2/2018 | Akimoto | G06F 3/0412 |
| 2018/0182818 A1* | 6/2018 | Kim | H01L 27/323 |

FOREIGN PATENT DOCUMENTS

| | | |
|---|---|---|
| JP | 2014-153791 A | 8/2014 |
| JP | 2014-211685 A | 11/2014 |
| JP | 2015-215882 A | 12/2015 |
| JP | 2016-012555 A | 1/2016 |
| JP | 2016-110613 A | 6/2016 |
| JP | 2016-188976 A | 11/2016 |
| WO | WO 2015/068654 | 5/2015 |

OTHER PUBLICATIONS

Japan Patent Office, Notice of Reasons for Refusal, JP Patent Application No. 2017-237747, dated May 28, 2019, ten pages.

* cited by examiner

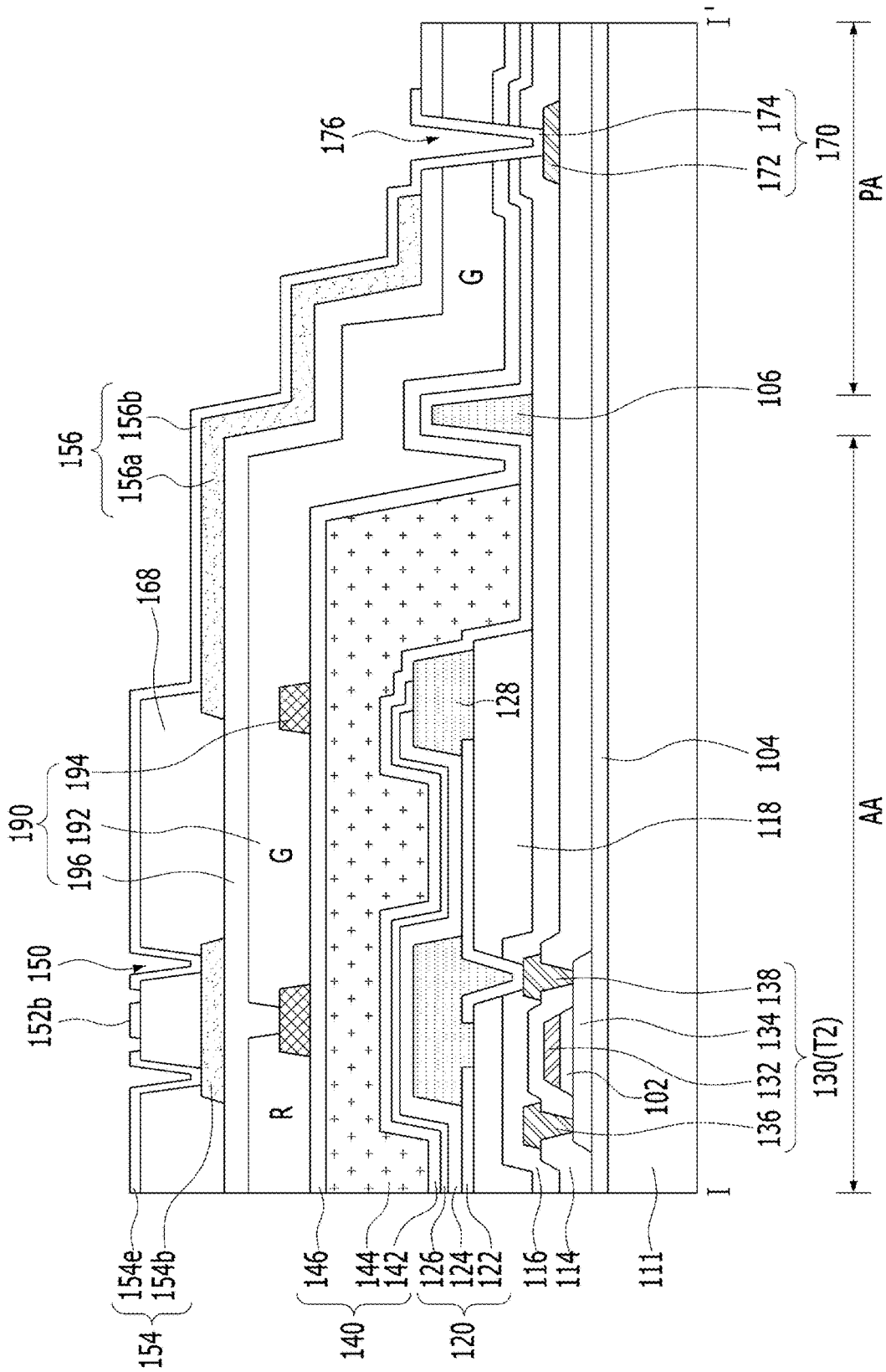

DISPLAY DEVICE

This application claims the benefit of Korean Patent Application No. 10-2016-0181125, filed on Dec. 28, 2016, which is hereby incorporated by reference as if fully set forth herein.

BACKGROUND OF THE INVENTION

Field of the Invention

The present invention relates to a display device, and more particularly to a display device manufactured through a simplified process at reduced cost.

Discussion of the Related Art

A touchscreen is an input device that allows a user to input a command by selecting one of multiple instructions displayed on a screen, such as a display device, using a user's hand or an object. That is, the touchscreen converts a contact position at which the user's hand or the object directly contacts the touchscreen into an electrical signal to receive the instruction selected at the contact position as an input signal. The touchscreen has been increasingly used, since the touchscreen is capable of replacing an additional input device that is connected to the display device for operation, such as a keyboard or a mouse.

In most cases, the touchscreen is generally attached to the front of a display panel, such as a liquid crystal display panel or an organic electro-luminescence display panel, using an adhesive. Since the touchscreen is separately manufactured and is attached to the front of the display panel, the process is complicated and cost is increased due to the addition of an attaching step.

SUMMARY OF THE INVENTION

Accordingly, the present invention is directed to a display device that substantially obviates one or more problems due to limitations and disadvantages of the related art.

An object of the present invention is to provide a display device manufactured through a simplified process at reduced cost.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display device having a touch sensor is configured such that a color filter array, which is disposed between an encapsulation unit and the touch sensor, extends to a pad area to contact the touch pad, thereby reducing stress on the pad area, and such that touch electrodes are disposed on the encapsulation unit, with the result that an additional bonding process is not required, whereby the process is simplified and cost is reduced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

FIGS. 7A, 7B, 7C, and 7D are sectional views showing other embodiments of a pad area shown in FIG. 6.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
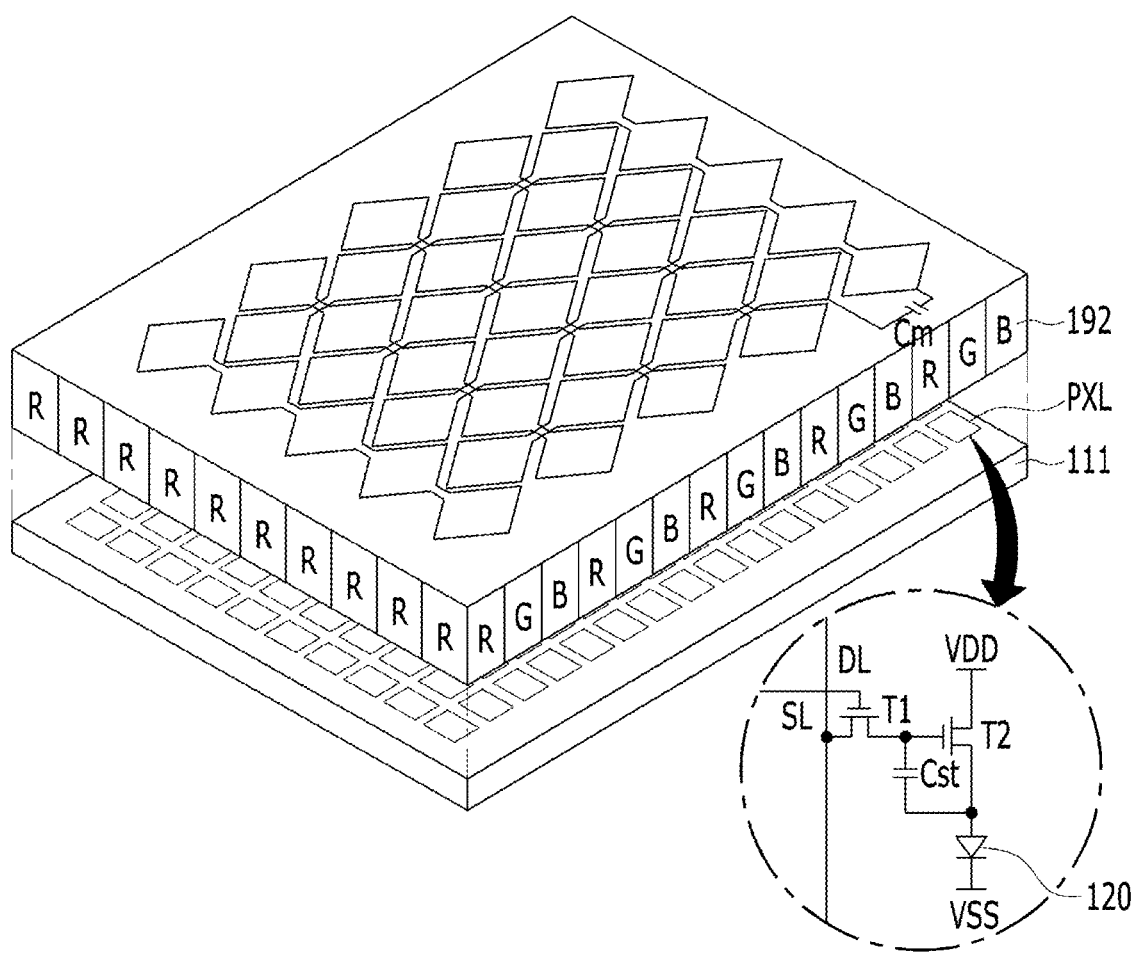
FIG. 1 is a perspective view showing an organic light-emitting display device having a touch sensor according to a first embodiment of the present invention.

FIG. 1 is a perspective view showing an organic light-emitting display device having a touch sensor according to a first embodiment of the present invention.

Figure 2:
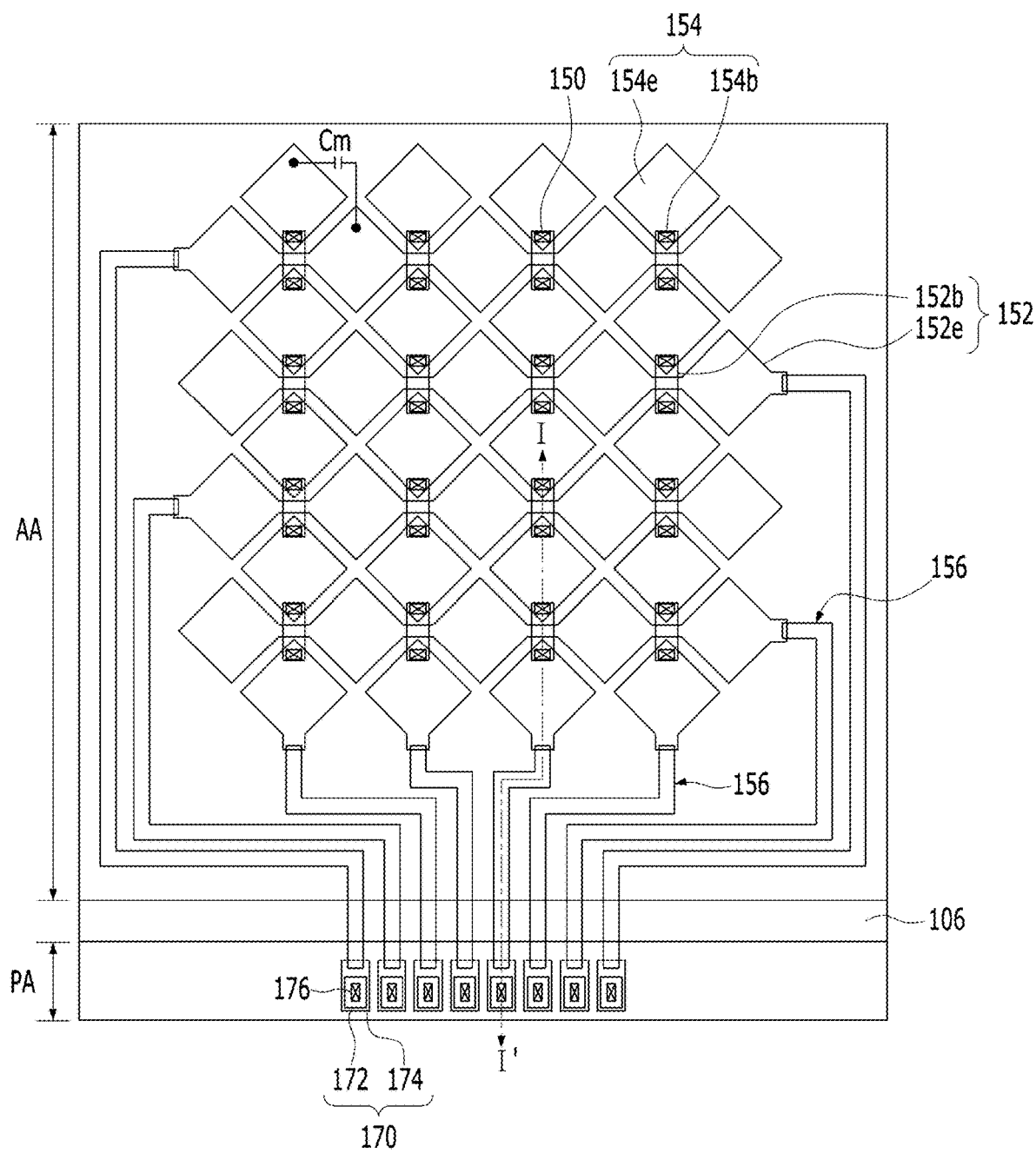
FIG. 2 is a plan view of the organic light-emitting display device having the touch sensor shown in FIG. 1.

The organic light-emitting display device having the touch sensor shown in FIG. 1 detects variation in a mutual capacitance Cm (the touch sensor) due to a user's touch through touch electrodes 152e and 154e shown in FIG. 2 during a touch period to sense whether a touch has been performed and the touched position. The organic light-emitting display device having the touch sensor shown in FIG. displays an image through respective unit pixels each including a light-emitting element 120. Each unit pixel includes red (R), green (G), and blue (B) sub-pixels PXL. Alternatively, each unit pixel may include red (R), green (G), blue (B), and white (W) sub-pixels PXL.

To this end, the organic light-emitting display device shown in FIG. 1 includes a plurality of sub-pixels PXL arranged on a substrate 111 in a matrix fashion, an encapsulation unit disposed on the sub-pixels PXL, a color filter array including a color filter 192 disposed on the encapsulation unit, and a mutual capacitance Cm disposed on the color filter array.

Each of the sub-pixels PXL includes a pixel-driving circuit and a light-emitting element 120 connected to the pixel-driving circuit.

The pixel-driving circuit includes a switching transistor T1, a driving transistor T2, and a storage capacitor Cst. A pixel-driving circuit including two transistors and one capacitor will be described by way of example. However, the present invention is not limited thereto. That is, a 3T1C or 3T2C type pixel-driving circuit having three or more transistors T and one or more capacitors C may be used.

When a scan pulse is supplied to a scan line SL, the switching transistor T1 is turned on to supply a data signal, supplied to a data line DL, to the storage capacitor Cst and a gate electrode of the driving transistor T2.

In response to the data signal supplied to the gate electrode of the driving transistor T2, the driving transistor T2 controls current I supplied from a high-voltage (VDD) supply line to the light-emitting element 120 to adjust the amount of light emitted by the light-emitting element 120. Even when the switching transistor T1 is turned off, the driving transistor T2 supplies uniform current I to the light-emitting element 120 using voltage charged in the storage capacitor Cst such that the light-emitting element 120 keeps emitting light until a data signal of the next frame is supplied.

Figure 3:
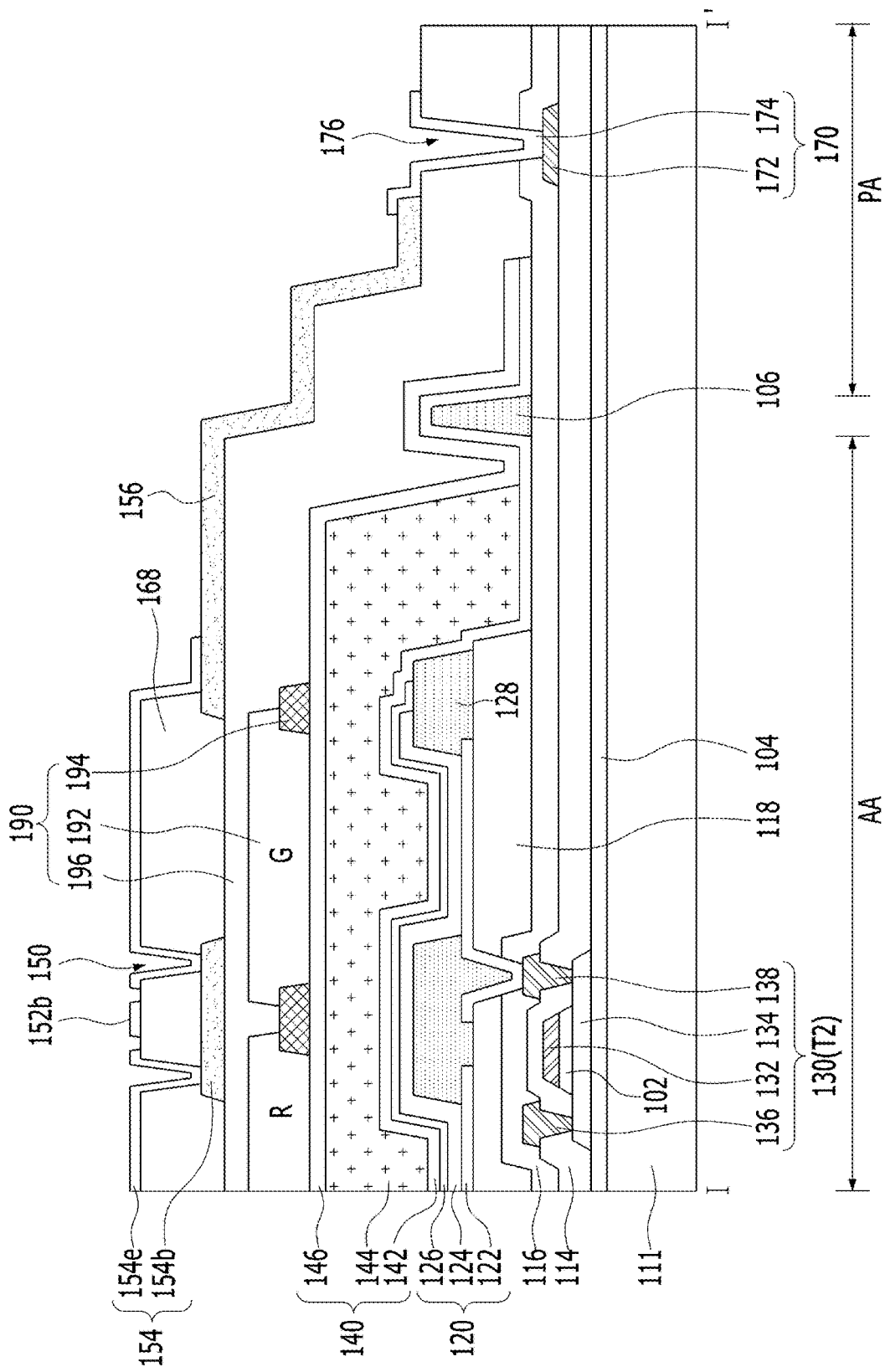
FIG. 3 is a sectional view of the organic light-emitting display device having the touch sensor taken along line I-I' of FIG. 2.

As shown in FIG. 3, the driving thin film transistor T2 (130) includes a semiconductor layer 134 disposed on a buffer layer 104, which is a first dielectric film, a gate electrode 132 overlapping the semiconductor layer 134 in the state in which a gate dielectric film 102, which is a second dielectric film, is disposed therebetween, and source and drain electrodes 136 and 138 formed on an interlayer dielectric film 114, which is a third dielectric film, to contact the semiconductor layer 134. The semiconductor layer 134 is formed of at least one selected from among an amorphous semiconductor material, a polycrystalline semiconductor material, and an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving thin film transistor 130, exposed through a pixel contact hole formed through a passivation film 116, which is a fourth dielectric film, and a pixel planarization layer 118.

The light-emitting stack 124 is formed on the anode electrode 122 in a light-emitting area defined by a bank 128. The light-emitting stack 124 is formed by stacking a hole-related layer, an organic light-emitting layer, and an electron-related layer on the anode electrode 122 in the forward order or in the reverse order. The light-emitting stack 124 may include first and second light-emitting stacks opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 is incident on the color filter 192, which is located above or under the light-emitting stack 124, to realize a color image. In addition, each light-emitting stack 124 may generate colored light corresponding to each sub-pixel without an additional color filter to realize a color image. That is, the light-emitting stack 124 of the red (R) sub-pixel may generate red light, the light-emitting stack 124 of the green (G) sub-pixel may generate green light, and the light-emitting stack 124 of the blue (B) sub-pixel may generate blue light.

The cathode electrode 126 is formed to be opposite the anode electrode 122 in the state in which the light-emitting stack 124 is disposed therebetween, and is connected to a low-voltage (VSS) supply line.

The encapsulation unit 140 prevents external moisture or oxygen from permeating into the light-emitting element 120, which has low resistance to the moisture or the oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is disposed at the uppermost layer. The encapsulation unit 140 includes at least two inorganic encapsulation layers 142 and 146 and at least one organic encapsulation layer 144. An encapsulation unit 140 having a structure in which an organic encapsulation layer 144 is disposed between first and second inorganic encapsulation layers 142 and 146 will be described by way of example.

The first inorganic encapsulation layer 142 is formed on the substrate 111, on which the cathode electrode 126 is formed, to be closest to the light-emitting element 120. The first inorganic encapsulation layer 142 is formed of an inorganic dielectric material that can be deposited at a low temperature, such as silicon nitride ($SiN_x$), silicon oxide ($SiO_x$), silicon oxide nitride (SiON), or aluminum oxide ($Al_2O_3$). Consequently, the first inorganic encapsulation layer 142 is deposited in a low-temperature atmosphere, whereby it is possible to prevent damage to the light-emitting stack 124, which has low resistance to a high-temperature atmosphere, when the first inorganic encapsulation layer 142 is deposited.

The organic encapsulation layer 144 reduces stress between the layers due to bending of the organic light-emitting device and improves planarization. The organic encapsulation layer 144 is formed of an organic dielectric material, such as acrylic resin, epoxy resin, polyimide, polyethylene, or silicon oxycarbide (SiOC).

Meanwhile, in the case in which the organic encapsulation layer 144 is formed using an inkjet method, a plurality of dams 106 is formed between a pad area PA, in which a touch pad 170 is formed, and an active area AA, in which the light-emitting element 120 is formed. When the organic encapsulation layer 144, which is in a liquid state, is dropped to the active area AA, the dams 106 prevent the organic encapsulation layer 144 from permeating into the pad area PA. The dams 106 are formed to have a single-layer structure or a multi-layer structure. For example, the dams 106 are formed of the same material at the same time as at least one selected from between the bank 128 or a spacer (not shown), whereby it is possible to prevent the addition of a mask process and an increase in cost. In addition, a plurality of routing lines 156, which cross the dams 106, is disposed above the dams 106. At least one selected from among a color filter 192, a black matrix 194, and a touch planarization layer 196 included in the color filter array 190 is disposed, along with the first and second inorganic encapsulation layers 142 and 146, between the routing lines 156 and the dams 106.

The second inorganic encapsulation layer 146 is formed on the substrate 111, on which the organic encapsulation layer 144 is formed, to cover the upper surfaces and the side surfaces of the organic encapsulation layer 144 and the first inorganic encapsulation layer 142. Consequently, the second inorganic encapsulation layer 146 reduces or prevents external moisture or oxygen from permeating into the first inorganic encapsulation layer 142 and the organic encapsulation layer 144. The second inorganic encapsulation layer 146 is formed of an inorganic dielectric material, such as silicon nitride ($SiN_x$), silicon oxide ($SiO_x$), silicon oxide nitride (SiON), or aluminum oxide ($Al_2O_3$).

Figure 4A:
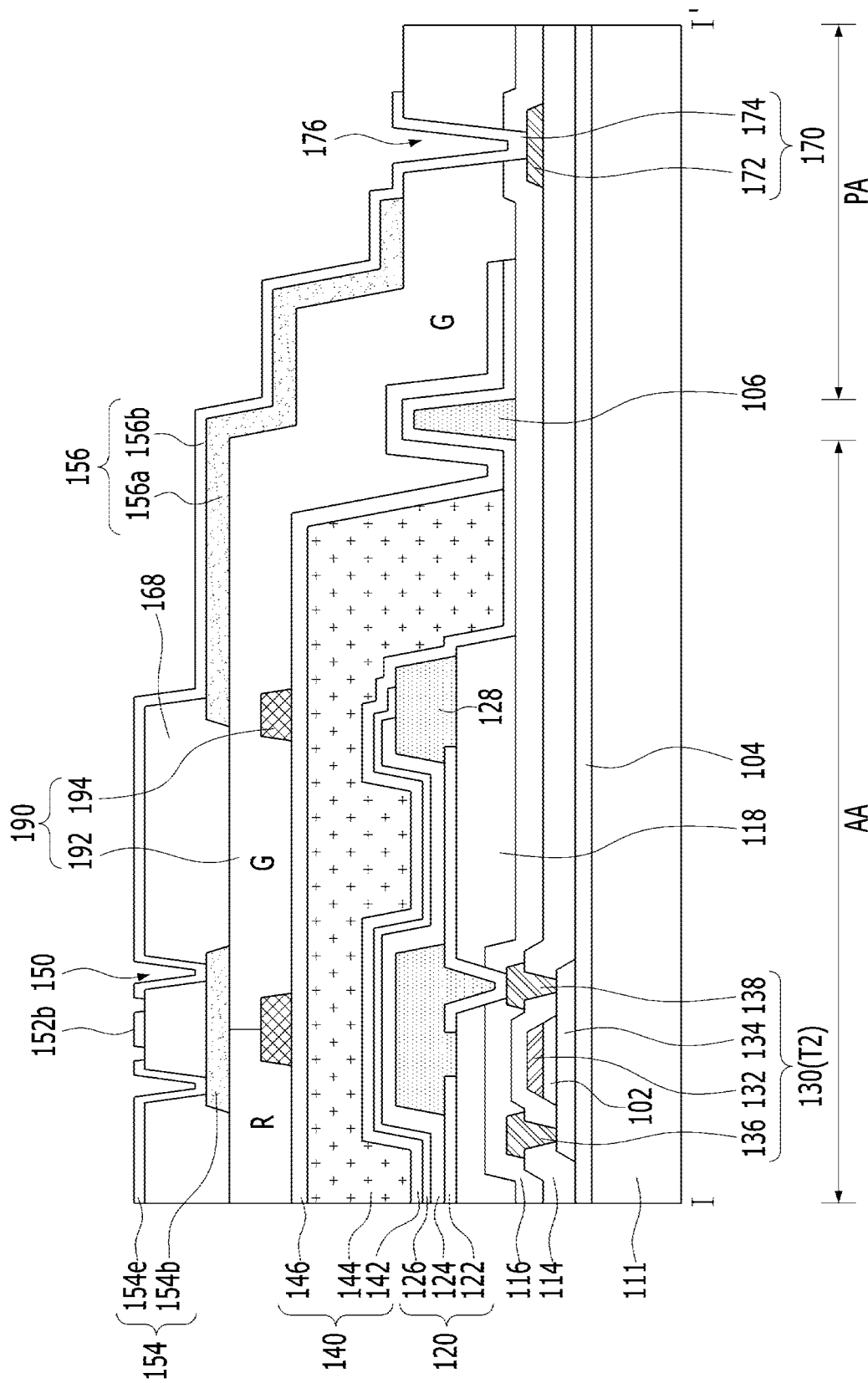
FIGS. 4A, 4B, 4C, and 4D are sectional views showing other embodiments of a pad area shown in FIG. 3.

The color filter array 190 is disposed on the encapsulation unit 140. As shown in FIG. 3, the color filter array 190 may include a black matrix 194, a color filter 192, and a touch planarization layer 196. Alternatively, as shown in FIG. 4A, the color filter array 190 may include a black matrix 194 and a color filter 192, without a touch planarization layer 196.

The black matrix 194 serves to divide the red (R), green (G), and blue (B) sub-pixels PXL from each other and to prevent optical interference between adjacent sub-pixels PXL. The black matrix 194 is formed to overlap the bank 128.

The color filter 192 is formed on the encapsulation unit 140 in the active area AA to realize a color corresponding to each sub-pixel PXL. To this end, the red (R) color filter 192 is formed on the encapsulation unit 140 of the red (R) sub-pixel PXL, the green (G) color filter 192 is formed on the encapsulation unit 140 of the green (G) sub-pixel PXL, and the blue (B) color filter 192 is formed on the encapsulation unit 140 of the blue (B) sub-pixel PXL. Consequently, white light generated by the light-emitting element 120 is output through the color filter 192 to realize a color image.

The touch planarization layer 196 is formed of a transparent organic dielectric material, and is formed on the color filter 192 and the black matrix 194. The touch planarization layer 196 compensates for the height difference between the color filter 192 and the black matrix 194 to provide a planar surface. Meanwhile, in the structure of FIG. 4A, in which the touch planarization layer 196 is not formed, a planar surface may be provided using the color filter 192 and the black matrix 194.

The color filter array 190, which includes the black matrix 194, the color filter 192, and the touch planarization layer 196, is formed between a touch-sensing line 154 and the light-emitting element 120 and between a touch-driving line 152 and the light-emitting element 120. The distance between the touch-sensing line 154 and the light-emitting element 120 and between the touch-driving line 152 and the light-emitting element 120 is increased by the color filter array 190. Consequently, it is possible to reduces the capacitance value of a parasitic capacitor formed between the touch-sensing line 154 and the light-emitting element 120 and between the touch-driving line 152 and the light-emitting element 120, thereby preventing interaction due to coupling between the touch-sensing line 154 and the light-emitting element 120 and between the touch-driving line 152 and the light-emitting element 120. In addition, the color filter array 190 may prevent a liquid chemical (e.g. a developing solution or an etching solution), which is used to form the touch-sensing line 154 and the touch-driving line 152, or external moisture from permeating into the light-emitting stack 124. Consequently, the color filter array 190 may prevent damage to the light-emitting stack 124, which has low resistance to the liquid chemical or to the moisture. In addition, the touch-sensing line 154 and the touch-driving line 152 are disposed on the color filter array 190 that provides a planar surface by at least one selected from between the color filter 192 and the touch planarization layer 196. Therefore, it is possible to prevent breakage of the touch-sensing line 154 and the touch-driving line 152 due to foreign matter or a height difference and to prevent an increase in resistance.

The touch-sensing line 154 and the touch-driving line 152 are disposed on the color filter array 190 to intersect each other in the state in which a touch dielectric film 168 is disposed therebetween, whereby a mutual capacitance Cm is formed at the intersection of the touch-sensing line 154 and the touch-driving line 152. Consequently, the mutual capacitance Cm charges an electric charge by a touch-driving pulse supplied to the touch-driving line 152 and discharges the charged electric charge to the touch-sensing line 154, thereby serving as a touch sensor.

The touch-driving line 152 includes a plurality of first touch electrodes 152e and first bridges 152b for electrically interconnecting the first touch electrodes 152e.

The first touch electrodes 152e are spaced apart from each other on the touch dielectric film 168 by a predetermined distance in an X direction, which is a first direction. Each of the first touch electrodes 152e is electrically connected to an adjacent first touch electrode 152e via a corresponding one of the first bridges 152b.

The first bridges 152b are disposed on the touch dielectric film 168, which is disposed in the same plane as the first touch electrodes 152e, to be electrically connected to the first touch electrode 152e without additional contact holes. The first bridges 152b are disposed to overlap the bank 128, whereby it is possible to prevent the reduction of an aperture ratio due to the first bridges 152b.

The touch-sensing line 154 includes a plurality of second touch electrodes 154e and second bridges 154b for electrically interconnecting the second touch electrodes 154e.

The second touch electrodes 154e are spaced apart from each other on the touch dielectric film 168 by a predetermined distance in a Y direction, which is a second direction. Each of the second touch electrodes 154e is electrically connected to an adjacent second touch electrode 154e via a corresponding one of the second bridges 154b.

The second bridges 154b are disposed on the touch planarization layer 196, and are exposed through touch contact holes 150, formed through the touch dielectric film 168, to be electrically connected to the second touch electrodes 154e. In the same manner as the first bridges 152b, the second bridges 154b are disposed to overlap the bank 128, whereby it is possible to prevent the reduction of an aperture ratio due to the second bridges 154b.

The touch-driving line 152 and the touch-sensing line 154 are connected to a touch-driving unit (not shown) via the routing lines 156 and the touch pad 170, respectively.

The routing lines 156 are formed between the first touch electrodes 152e and the touch pad 170 and between the second touch electrodes 154e and the touch pad 170 to electrically connect the first and second touch electrodes 152e and 154e to the touch pad 170. Consequently, the routing lines 156 transmit a touch-driving pulse generated by the touch-driving unit to the touch-driving line 152 via the touch pad 170 and transmit a touch signal from the touch-sensing line 154 to the touch-driving unit via the touch pad 170. The routing lines 156 extend from the first touch electrodes 152e to one selected from between the left side and the right side of the active area AA to be connected to the touch pad 170. In addition, the routing lines 156 extend from the second touch electrodes 154e to one selected from between the upper side and the lower side of the active area AA to be connected to the touch pad 170. The disposition of the routing lines 156 may be variously changed depending on the design of the display device.

The routing lines 156 are formed to have a single-layer structure, as shown in FIG. 3. Alternatively, the routing lines 156 may be formed to have a multi-layer structure, as shown in FIGS. 4A to 4D. The routing lines 156 having the single-layer structure shown in FIG. 3 are formed of the same material as the second bridges 154b or the first bridges 152*b*, and are disposed in the same plane as the second bridges 154*b* or the first bridges 152*b*. The routing lines 156 having the multi-layer structure shown in FIGS. 4A to 4D include first routing lines 156*a*, formed of the same material as the second bridges 154*b* and disposed in the same plane as the second bridges 154*b*, and second routing lines 156*b*, formed of the same material as the second touch electrodes 154*e* and disposed on the first routing lines 156*a* to directly contact the first routing lines 156*a*.

The touch pad 170 is disposed in an area adjacent to a display pad (not shown), which is connected to at least one selected from between the scan line SL and the data line DL disposed in the active area AA, to be parallel with the display pad. The touch pad 170 includes a pad electrode 172 and a pad cover electrode 174 disposed on the pad electrode 172 to cover the pad electrode 172.

The pad electrode 172 is disposed in the same plane as one selected from between the scan line SL and the data line DL (e.g. on the gate dielectric film 102 or on the interlayer dielectric film 114), and is formed of the same material as one selected from between the scan line SL and the data line DL.

The pad cover electrode 174 is connected to the routing lines 156. To this end, the pad cover electrode 174 is formed of the same material as the first and second touch electrodes 152*e* and 154*e* through the same mask process as the first and second touch electrodes 152*e* and 154*e*, and is directly connected to the side surfaces and the upper surfaces of the routing lines 156. In addition, the pad cover electrode 174 extends from the routing lines 156, since the pad cover electrode 174 is formed of the same material as the routing lines 156 through the same mask process as the routing lines 156. The pad cover electrode 174 is connected to a signal transmission film, on which the touch-driving unit is mounted.

In addition, the pad cover electrode 174 is disposed on the color filter array 190 to contact the color filter array 190, and is electrically connected to the pad electrode 172 exposed through a pad contact hole 176 formed through the color filter array 190.

Meanwhile, in the organic light-emitting display device having the touch sensor according to embodiments of the present invention, at least one selected from among the color filter 192, the black matrix 194, and the touch planarization layer 196, included in the color filter array 190, extends from the active area AA to the pad area PA to be connected thereto, as shown in FIGS. 3 and 4A to 4D.

That is, the touch planarization layer 196 shown in FIG. 3 extends to the pad area PA, whereby the routing lines 156 contact the touch planarization layer 196 to cover the side surface and the upper surface of the touch planarization layer 196. Consequently, the routing lines 156 are spaced apart from the second inorganic encapsulation layer 146 in the state in which the touch planarization layer 196 is disposed therebetween. The pad contact hole 176, through which the pad electrode 172 is exposed, is formed through the same mask process as the touch contact holes 150. That is, the pad contact hole 176 is formed through the passivation film 116 and the touch planarization layer 196 when the touch contact holes 150 are formed.

Since the color filter 192 shown in FIG. 4A extends to the pad area PA, the routing lines 156 contact the color filter 192 to cover the side surface and the upper surface of the color filter 192. Consequently, the routing lines 156 are spaced apart from the second inorganic encapsulation layer 146 in the state in which the color filter 192 is disposed therebetween. Since the pad contact hole 176, through which the pad electrode 172 is exposed, is formed through the same mask process as the touch contact holes 150, the pad contact hole 176 is formed through the passivation film 116 and the color filter 192 when the touch contact holes 150 are formed.

Figure 4B:
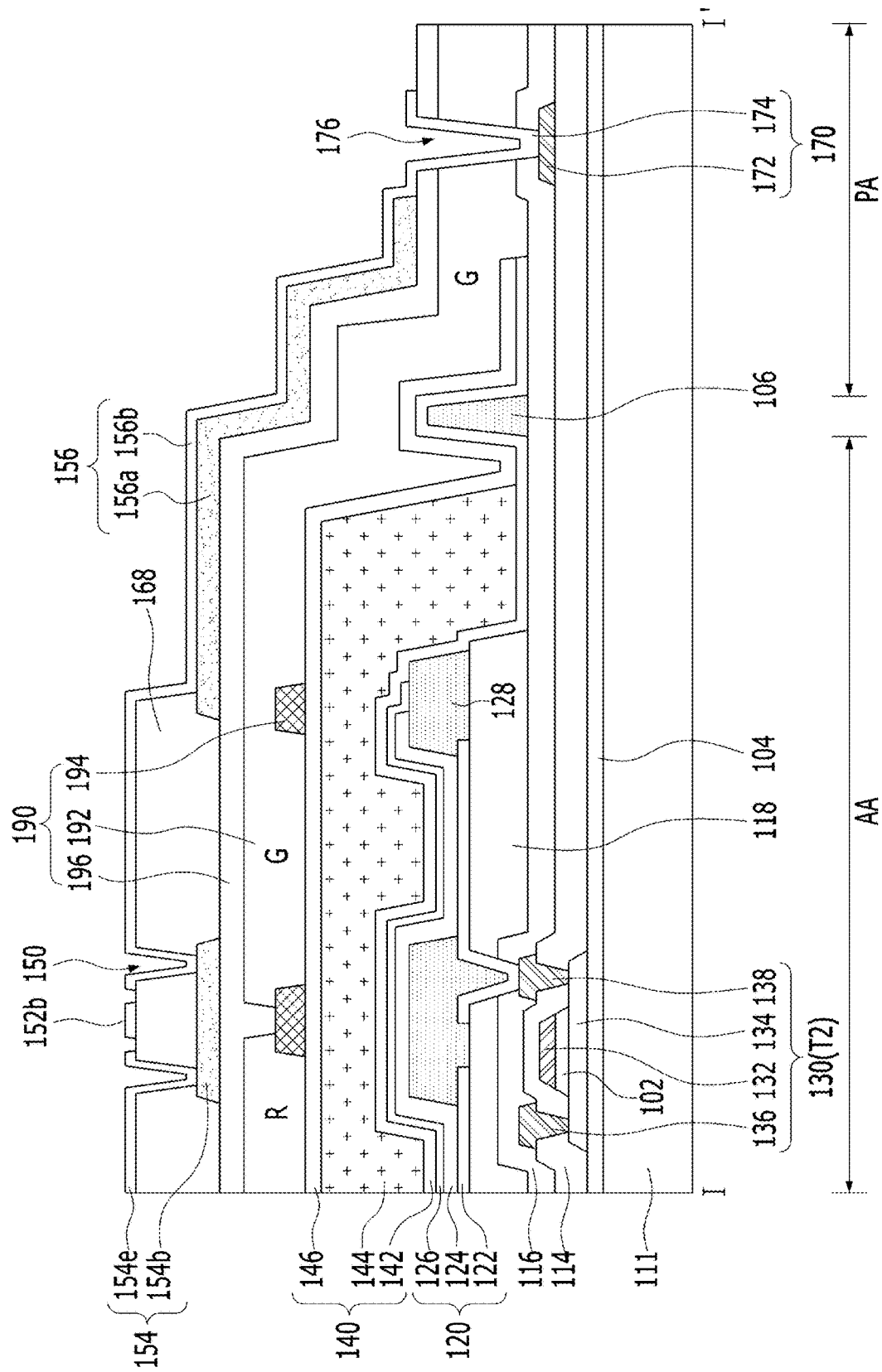

Since the color filter 192 and the touch planarization layer 196 shown in FIG. 4B extend to the pad area PA, the routing lines 156 contact the touch planarization layer 196 to cover the side surface and the upper surface of the touch planarization layer 196. Consequently, the routing lines 156 are spaced apart from the second inorganic encapsulation layer 146 in the state in which the color filter 192 and the touch planarization layer 196 are disposed therebetween. Since the pad contact hole 176, through which the pad electrode 172 is exposed, is formed through the same mask process as the touch contact holes 150, the pad contact hole 176 is formed through the passivation film 116, the color filter 192, and the touch planarization layer 196 when the touch contact holes 150 are formed.

Figure 4C:
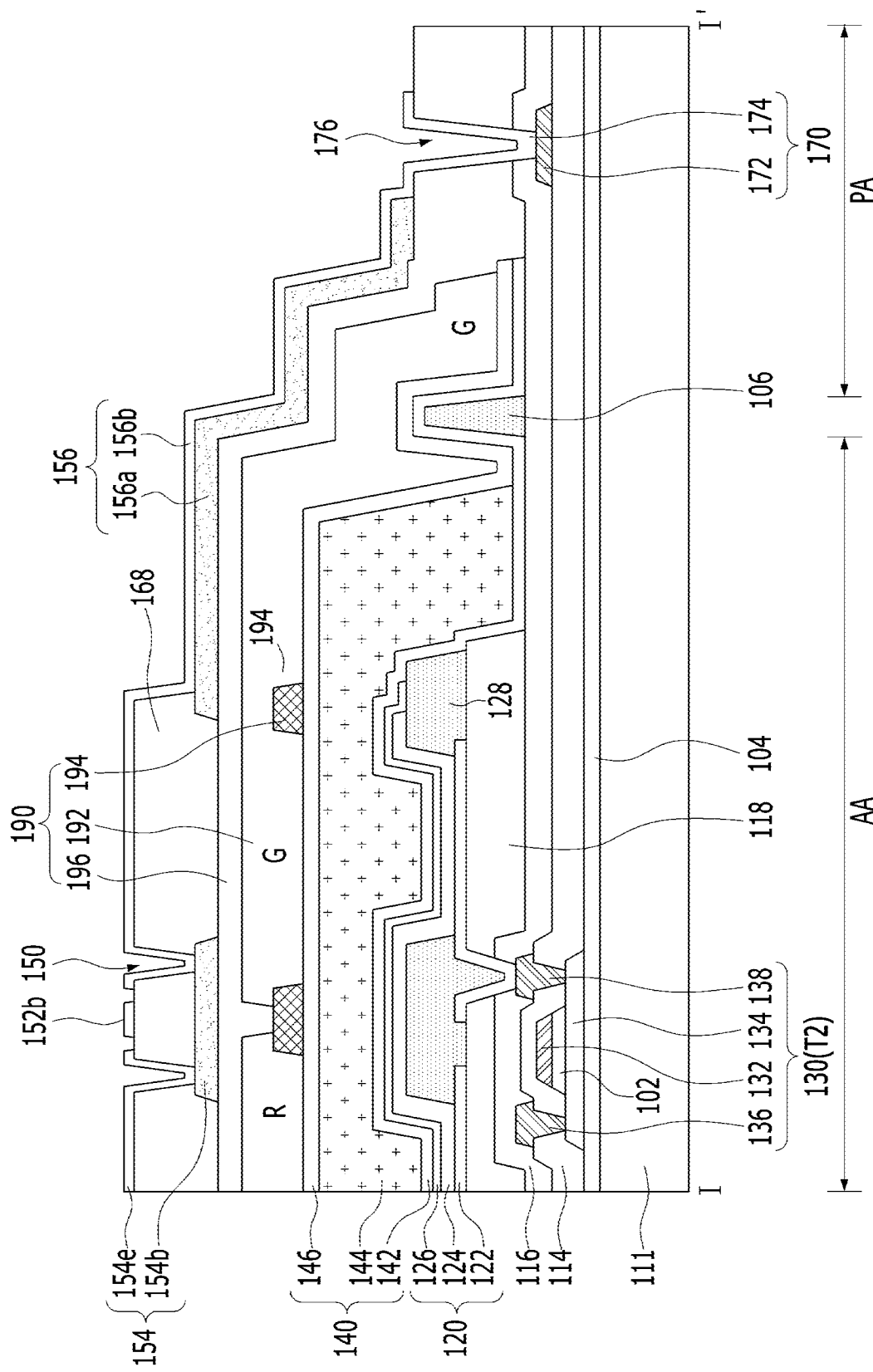

The touch planarization layer 196 shown in FIG. 4C extends from the active area AA to the pad area PA, and the color filter 192 extends from the active area AA to an area between the dams 106 and the touch pad 170. Consequently, the routing lines 156 contact the touch planarization layer 196 to cover the side surface and the upper surface of the touch planarization layer 196, and the routing lines 156 are spaced apart from the second inorganic encapsulation layer 146 in the state in which the color filter 192 and the touch planarization layer 196 are disposed therebetween. Since the pad contact hole 176, through which the pad electrode 172 is exposed, is formed through the same mask process as the touch contact holes 150, the pad contact hole 176 is formed through the passivation film 116 and the touch planarization layer 196 when the touch contact holes 150 are formed.

Figure 4D:
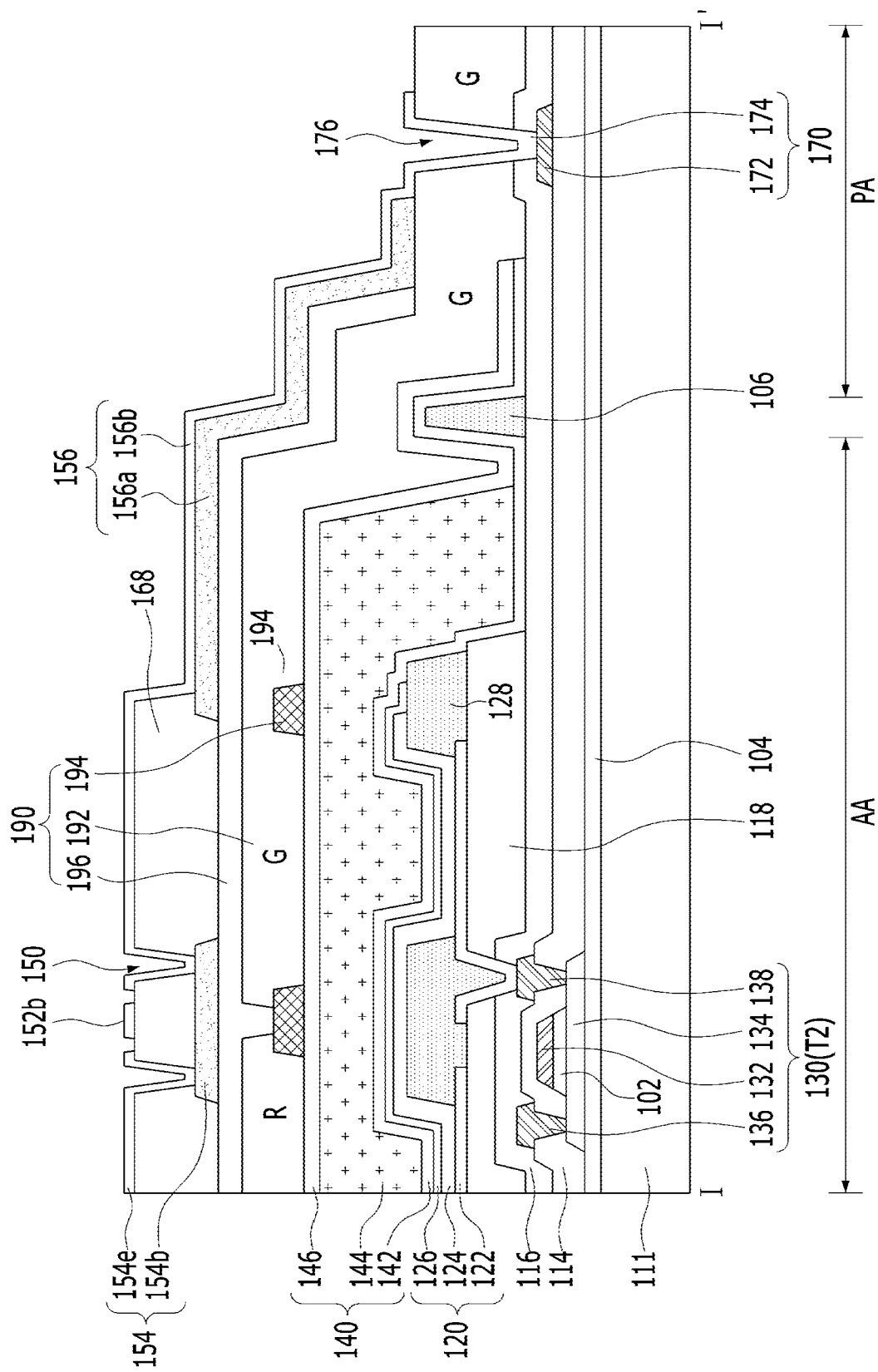

The color filter 192 shown in FIG. 4D extends from the active area AA to the pad area PA, and the touch planarization layer 196 extends from the active area AA to an area between the dams 106 and the touch pad 170. Consequently, the routing lines 156 contact the touch planarization layer 196 and the color filter 192 to cover the touch planarization layer 196 and the color filter 192, and the routing lines 156 are spaced apart from the second inorganic encapsulation layer 146 in the state in which the color filter 192 and the touch planarization layer 196 are disposed therebetween. Since the pad contact hole 176, through which the pad electrode 172 is exposed, is formed through the same mask process as the touch contact holes 150, the pad contact hole 176 is formed through the passivation film 116 and the color filter 192.

Figure 5:
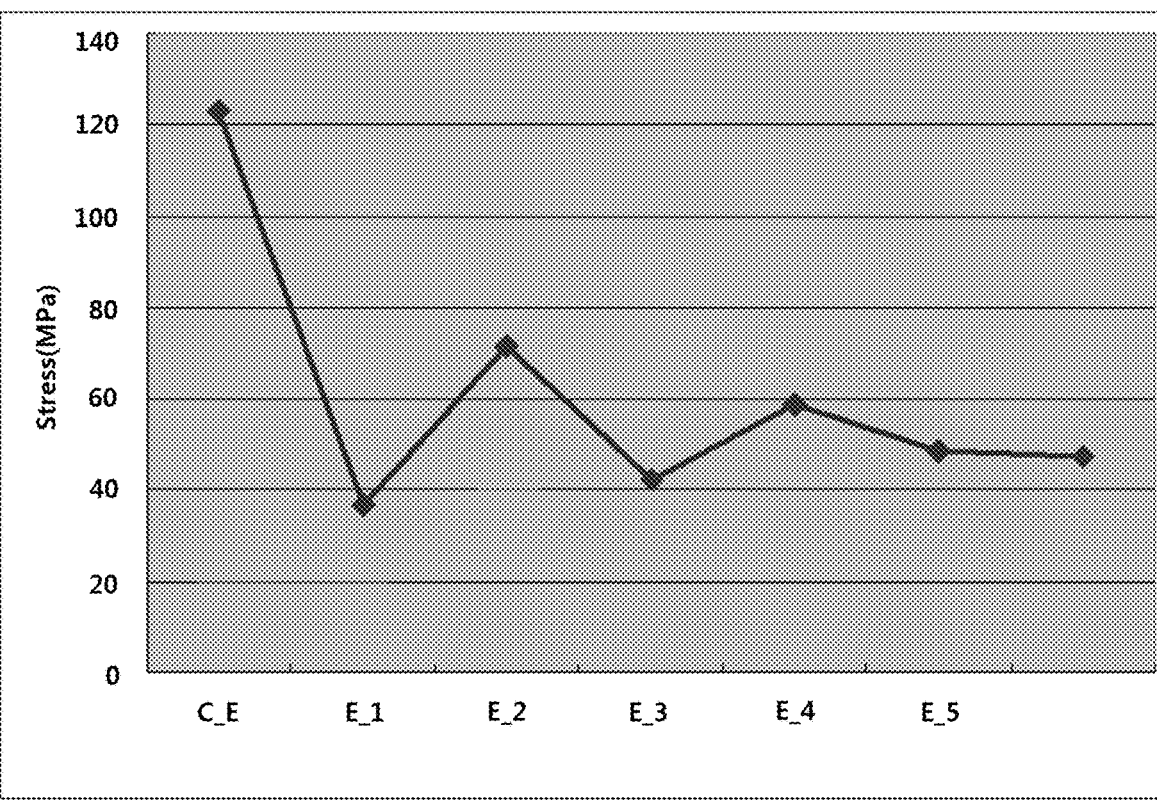
FIG. 5 is a graph showing stresses generated in display devices according to embodiments of the present invention and a comparative example.

Since the color filter array 190 extends to the pad area PA and the routing lines 156 in embodiments of the present invention, as described above, stress is reduced, whereby reliability is improved. That is, as shown in FIG. 5, embodiments 1 to 5, in which the inorganic film 116 and the organic films 192 and 196 are stacked on the pad electrode 172, are advantageous in the reduction of stress, as compared with a comparative example, in which only an inorganic film is disposed on a pad electrode.

In addition, in embodiments of the present invention, the color filter array 190 extends to the pad area PA, whereby it is possible to reduce the height difference between the active area AA and the pad area PA. That is, in the comparative example, in which a light-emitting element, a bank, an encapsulation unit, and a color filter array are disposed in an active area and a touch pad is disposed in a pad area, the height difference between the active area and the pad area is 10 µm or more. In contrast, in the embodiments of the present invention, the color filter array 190 extends to the pad area PA, whereby it is possible to reduce the height difference between the active area AA and the pad area PA by the thickness of the color filter array 190. In the present invention, therefore, it is possible to prevent breakage of the routing lines 156 crossing the height difference area between the active area AA and the pad area PA and to prevent an increase in resistance.

In addition, in the comparative example, in which the color filter array is not formed in the pad area, a pad electrode, a pad cover electrode, and a plurality of inorganic films including dielectric films are stacked in the pad area. As a result, the difference in stress between the pad area and the active area is large, with the result that the pad area, which is thinner than the active area, is rolled in a cylindrical shape. In addition, the inorganic film is peeled due to foreign matter, with the result that signal lines, such as routing lines, are broken. In contrast, in the embodiments of the present invention, in which the color filter array 190 is formed in the pad area PA, the inorganic films including the touch pad 170 and the dielectric films 104, 114, 116, 142, and 144 and the organic films included in the color filter array 190 are stacked in the pad area PA. As a result, the difference in stress between the pad area and the active area is small, with the result that the pad area PA is prevented from being rolled in a cylindrical shape. In addition, even when the inorganic film is peeled due to the presence of foreign matter, it is possible to prevent the routing lines 156 from breaking, since the routing lines 156 are disposed on the organic film included in the color filter array 190.

Furthermore, a touch screen is attached to the conventional organic light-emitting display device using an adhesive. In contrast, in the organic light-emitting display device according to embodiments of the present invention, the touch electrodes 152*e* and 154*e* are disposed on the encapsulation unit 140, with the result that an additional bonding process is not required, whereby the process is simplified and cost is reduced.

Figure 6:
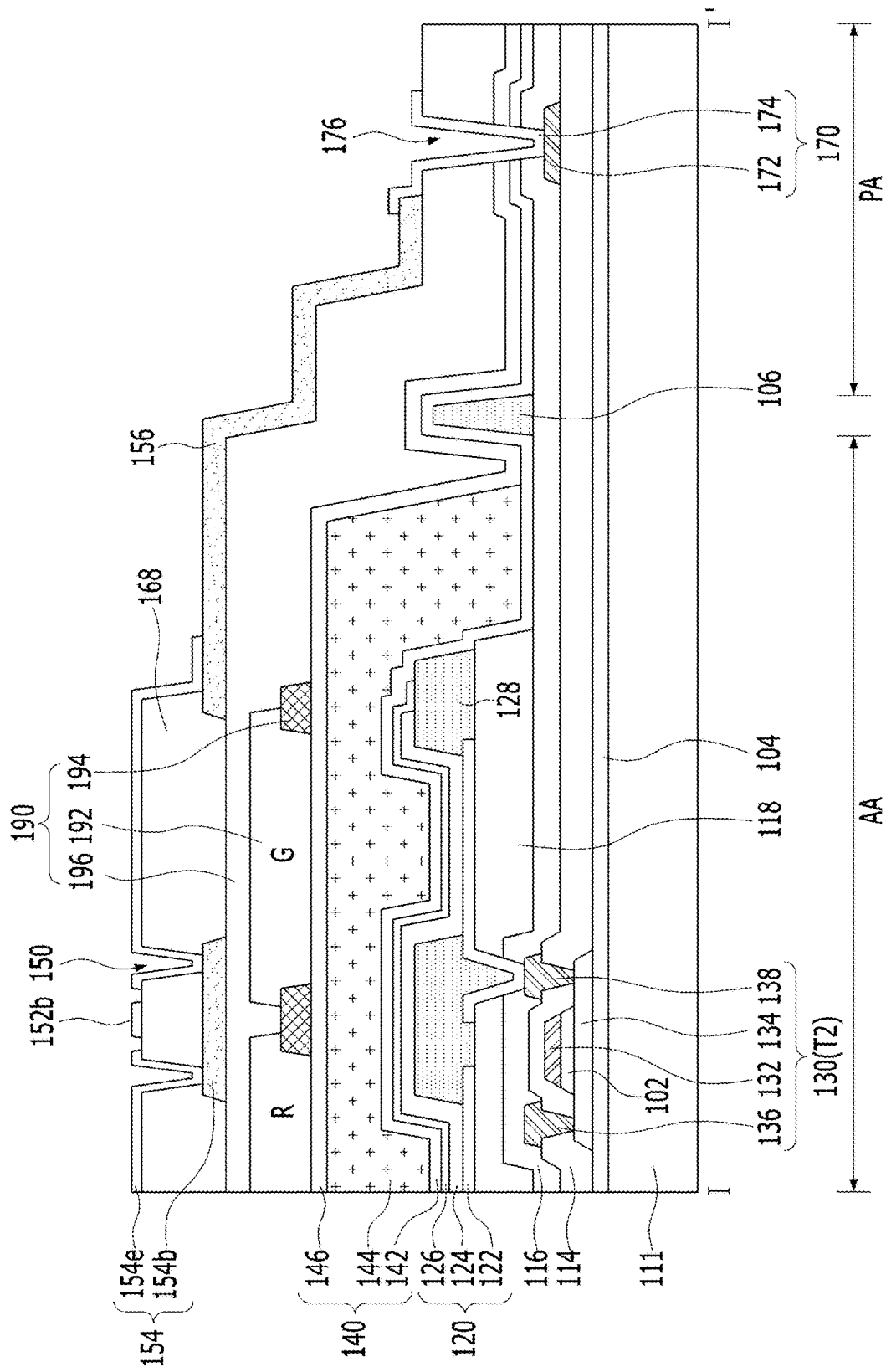
FIG. 6 is a sectional view showing an organic light-emitting display device having a touch sensor according to a second embodiment of the present invention.

FIG. 6 is a sectional view showing an organic light-emitting display device having a touch sensor according to a second embodiment of the present invention.

The organic light-emitting display device shown in FIG. 6 is identical in construction to the organic light-emitting display device shown in FIG. 3 except that the pad contact hole 176 is formed through the first and second inorganic encapsulation layers 142 and 146. Consequently, a detailed description of components of the organic light-emitting display device shown in FIG. 6 that are identical to those of the organic light-emitting display device shown in FIG. 3 will be omitted.

In the organic light-emitting display device having the touch sensor according to embodiments of the present invention, at least one selected from among the color filter 192, the black matrix 194, and the touch planarization layer 196, included in the color filter array 190, and the inorganic encapsulation layers 142 and 146 extend to the pad area PA, as shown in FIGS. 6 and 7A to 7D.

That is, since the touch planarization layer 196 shown in FIG. 6 extends to the pad area PA, the routing lines 156 contact the touch planarization layer 196 to cover the side surface and the upper surface of the touch planarization layer 196. Since the pad contact hole 176, through which the pad electrode 172 is exposed, is formed through the same mask process as the touch contact holes 150, the pad contact hole 176 is formed through the passivation film 116, the first and second inorganic encapsulation layers 142 and 146, and the touch planarization layer 196 when the touch contact holes 150 are formed. That is, when the pad contact hole 176 is formed, the passivation film 116, the first and second inorganic encapsulation layers 142 and 146, and the touch planarization layer 196 are etched simultaneously, thereby obviating the addition of a mask process.

Figure 7A:
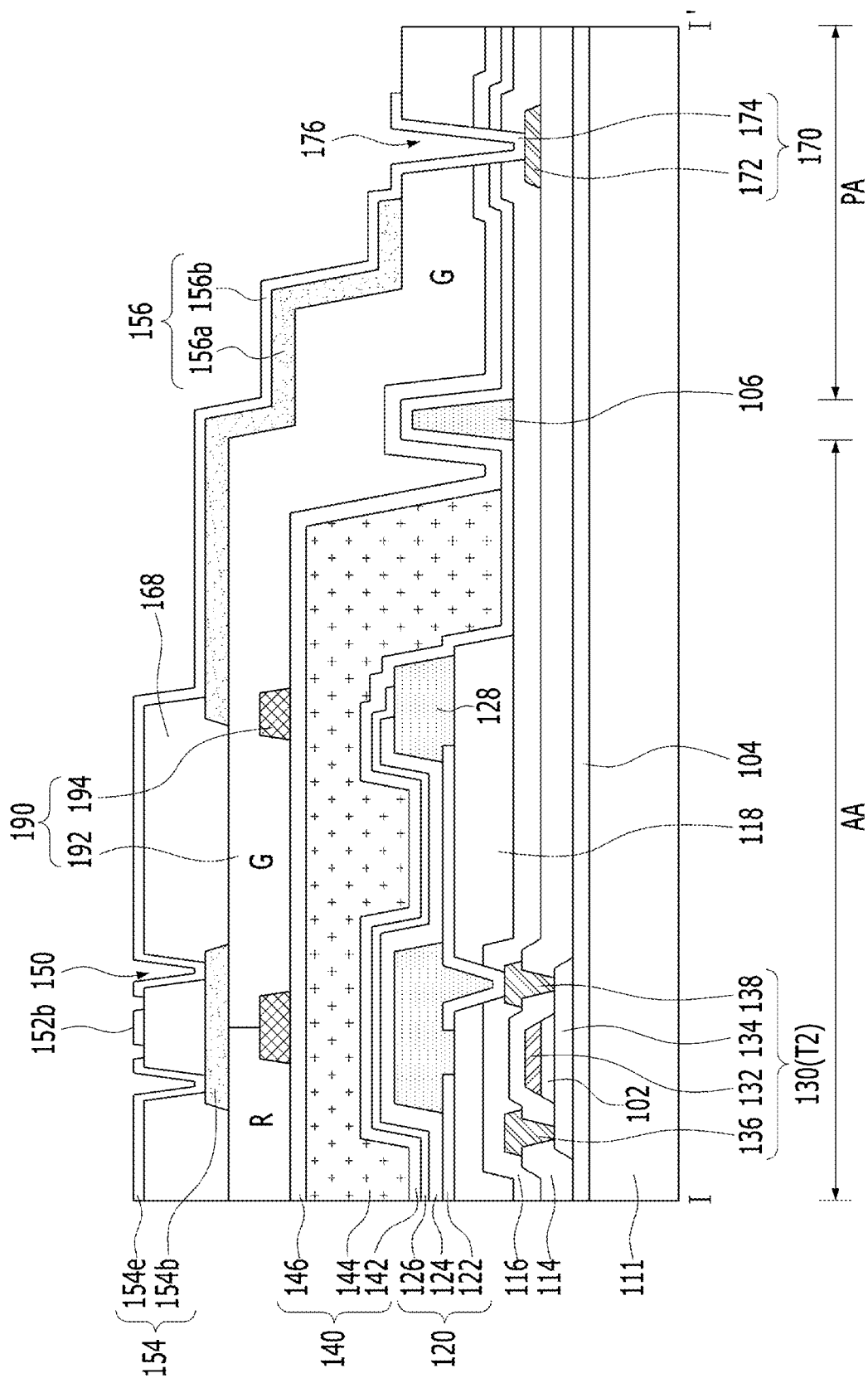

Since the color filter 192 shown in FIG. 7A extends to the pad area PA, the routing lines 156 contact the color filter 192 to cover the color filter 192. Since the pad contact hole 176, through which the pad electrode 172 is exposed, is formed through the same mask process as the touch contact holes 150, the pad contact hole 176 is formed through the passivation film 116, the first and second inorganic encapsulation layers 142 and 146, and the color filter 192 when the touch contact holes 150 are formed.

Since the color filter 192 and the touch planarization layer 196 shown in FIG. 7B extend to the pad area PA, the routing lines 156 contact the touch planarization layer 196 to cover the side surface of the touch planarization layer 196. Since the pad contact hole 176, through which the pad electrode 172 is exposed, is formed through the same mask process as the touch contact holes 150, the pad contact hole 176 is formed through the passivation film 116, the first and second inorganic encapsulation layers 142 and 146, the color filter 192, and the touch planarization layer 196 when the touch contact holes 150 are formed.

Figure 7C:
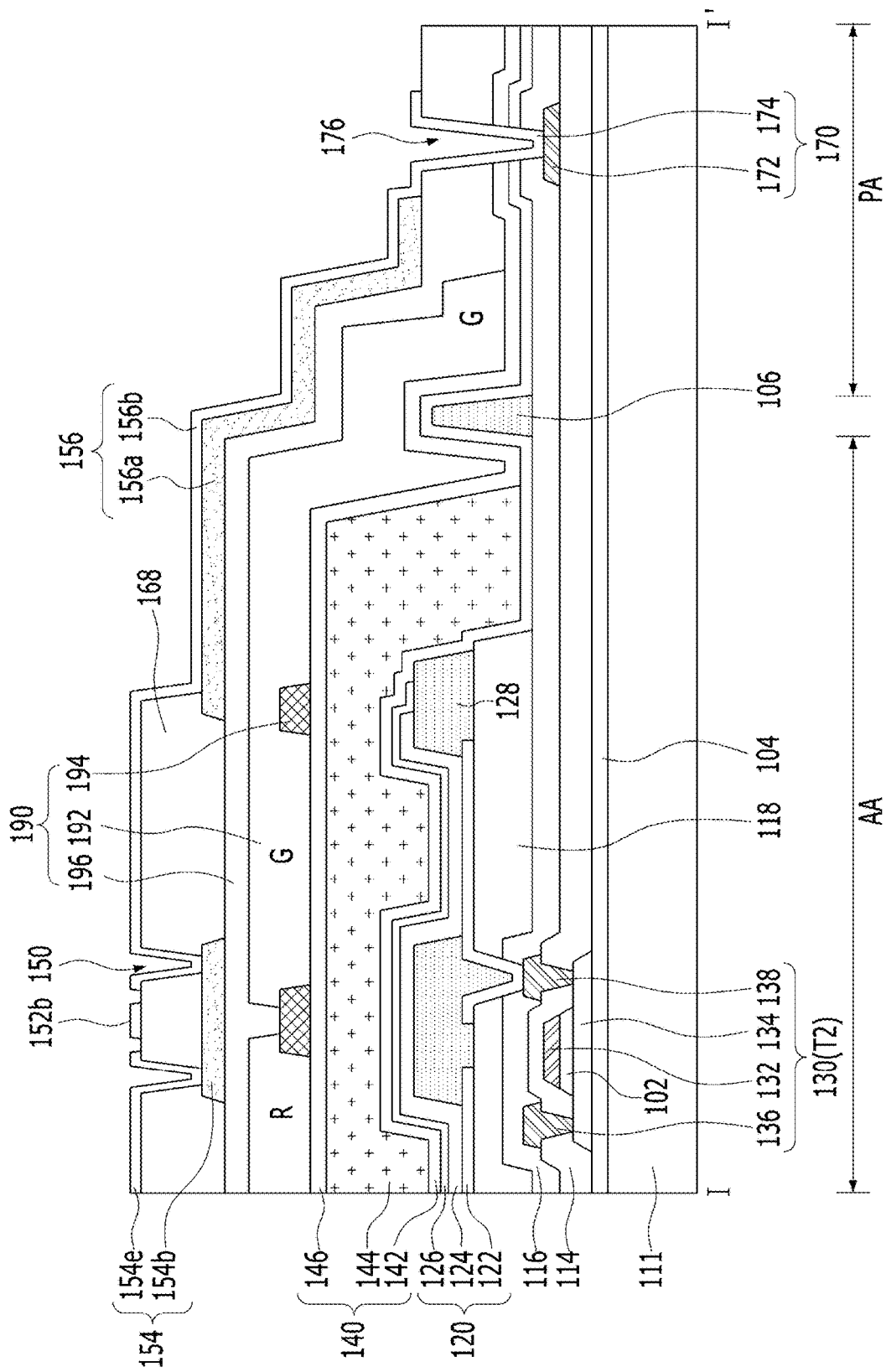

Since the touch planarization layer 196 shown in FIG. 7C extends to the pad area PA and the color filter 192 extends to a region between the dams 106 and the touch pad 170, the routing lines 156 contact the touch planarization layer 196 to cover the side surface of the touch planarization layer 196. The pad contact hole 176, through which the pad electrode 172 is exposed, is formed through the passivation film 116 and the first and second inorganic encapsulation layers 142 and 146 when the touch contact holes 150 are formed, the color filter 192 is formed to be removed from an area corresponding to the pad electrode 172 when the color filter 192 is formed, and the touch planarization layer 196 is formed to be removed from an area corresponding to the pad contact hole 176 when the touch planarization layer 196 is formed. Consequently, the pad contact hole 176 is formed through the passivation film 116, the first and second inorganic encapsulation layers 142 and 146, and the touch planarization layer 196.

Figure 7D:
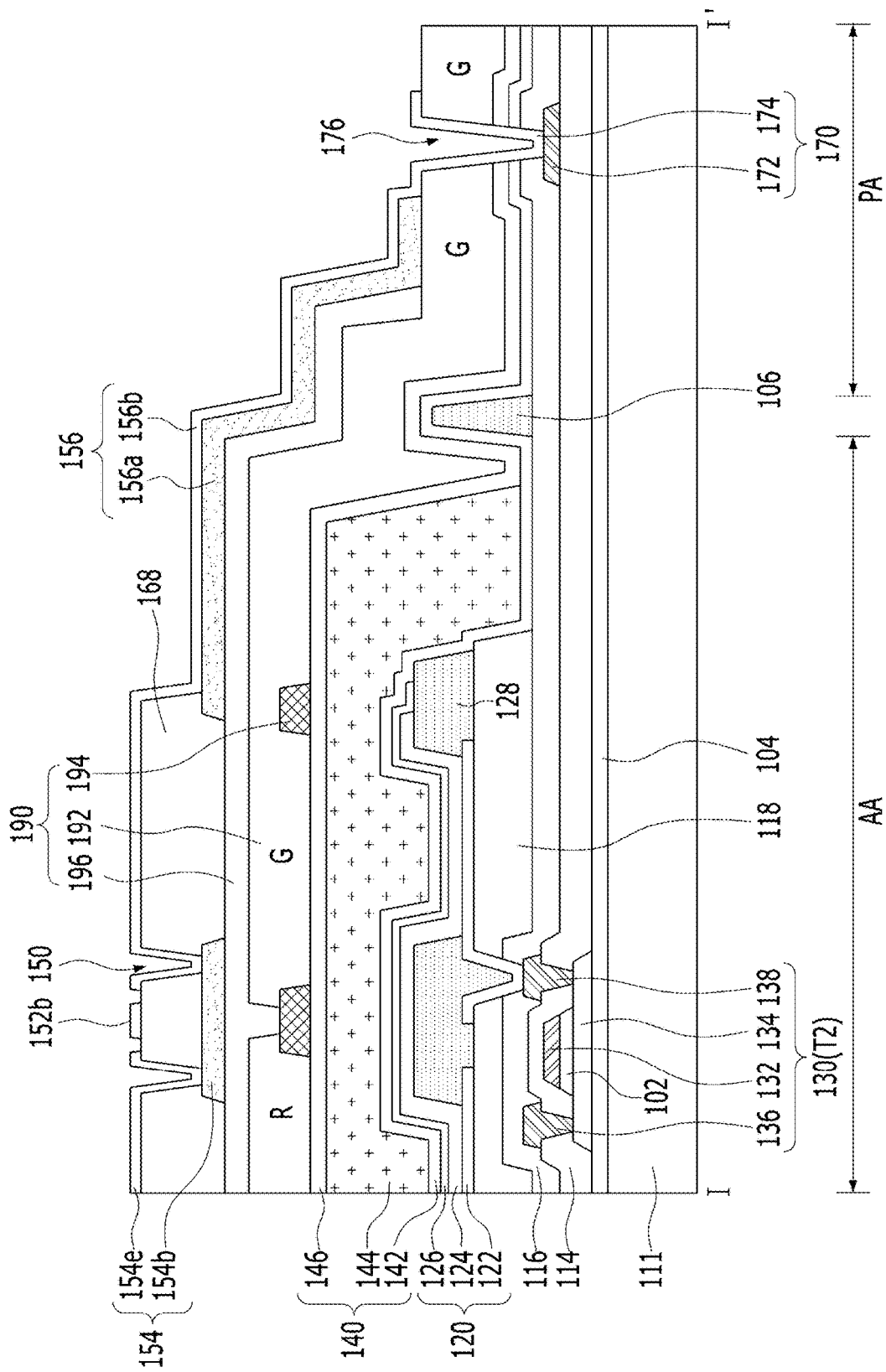

Since the color filter 192 shown in FIG. 7D extends to the pad area PA and the touch planarization layer 196 extends to a region between the dams 106 and the touch pad 170, the routing lines 156 contact the touch planarization layer 196 and the color filter 192 to cover the touch planarization layer 196 and the color filter 192. Since the pad contact hole 176, through which the pad electrode 172 is exposed, is formed through the same mask process as the touch contact holes 150, the pad contact hole 176 is formed through the passivation film 116, the first and second inorganic encapsulation layers 142 and 146, and the color filter 192 when the touch contact holes 150 are formed.

In an embodiment of the present invention, as described above, the color filter array 190 and the first and second inorganic encapsulation layers 142 and 146 extend to the pad area PA, whereby it is possible to reduce the height difference between the active area AA and the pad area PA. That is, in the embodiment of the present invention, it is possible to reduce the height difference between the active area AA and the pad area PA to the thickness of the color filter array 190 and the inorganic encapsulation layers 142 and 146. In the present invention, therefore, it is possible to prevent breakage of the routing lines 156 crossing the height difference area between the active area AA and the pad area PA and to prevent an increase in resistance.

In addition, in the embodiment of the present invention, the inorganic films including the touch pad 170 and the dielectric films 104, 114, 116, 142, and 144 and the organic films included in the color filter array 190 are stacked in the pad area PA. As a result, the difference in stress between the pad area and the active area is small, with the result that the pad area PA is prevented from being rolled in a cylindrical shape. In addition, even when the inorganic film is peeled due to the presence of foreign matter, it is possible to prevent the routing lines 156 from breaking, since the routing lines 156 are disposed on the organic film included in the color filter array 190.

Furthermore, a touch screen is attached to the conventional organic light-emitting display device using an adhesive. In contrast, in the organic light-emitting display device according to embodiments of the present invention, the touch electrodes 152e and 154e are disposed on the encapsulation unit 140, with the result that an additional bonding process is not required, whereby the process is simplified and cost is reduced.

Figure 8:
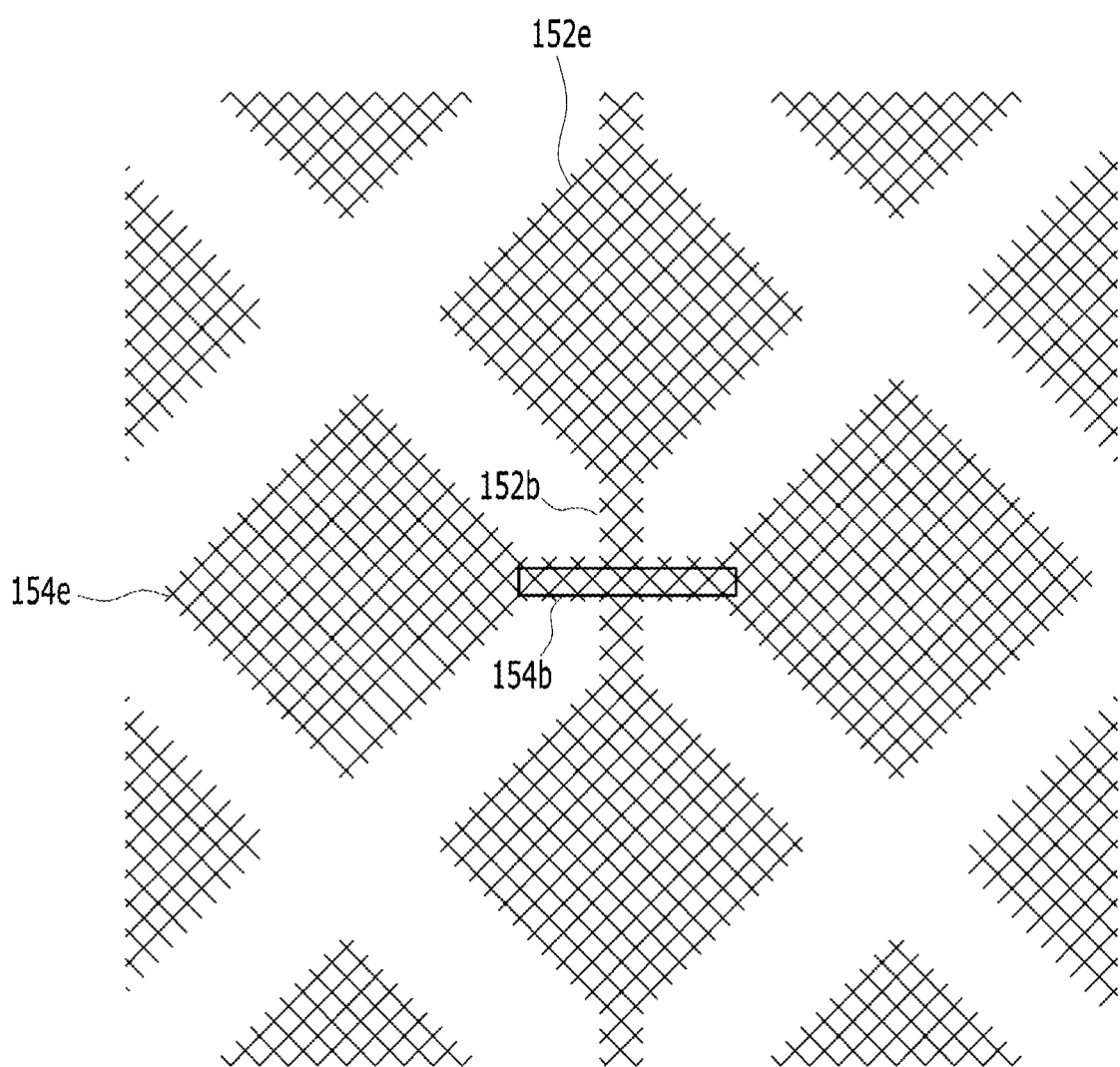
FIG. 8 is a plan view showing another embodiment of first and second touch electrodes shown in FIG. 2.

Meanwhile, in some embodiments of the present invention, the first and second touch electrodes 152e and 154e and the first and second bridges 152b and 154b are formed in a plate shape, as shown in FIG. 2. Alternatively, the first and second touch electrodes 152e and 154e and the first and second bridges 152b and 154b may be formed in a mesh shape, as shown in FIG. 8. That is, the first and second touch electrodes 152e and 154e and the first bridge 152b are formed in a mesh shape using at least one conductive layer selected from among Ti, Al, Mo, MoTi, Cu, and Ta, which exhibit higher conductivity than a transparent conductive film, such as ITO or IZO. For example, the first and second touch electrodes 152e and 154e and the first bridge 152b are formed to have a three-layer stack structure, such as Ti/Al/Ti, MoTi/Cu/MoTi, or Ti/Al/Mo. Consequently, the resistance and capacitance of the first and second touch electrodes 152e and 154e and the first bridge 152b are reduced, whereby an RC time constant is reduced and thus touch sensitivity is improved. In addition, the line width of the first and second touch electrodes 152e and 154e and the first bridge 152b, which are formed in the mesh shape, is very small, with the result that it is possible to prevent the reduction of an aperture ratio and transmittance due to the first and second touch electrodes 152e and 154e and the first bridge 152b.

Figure 9:
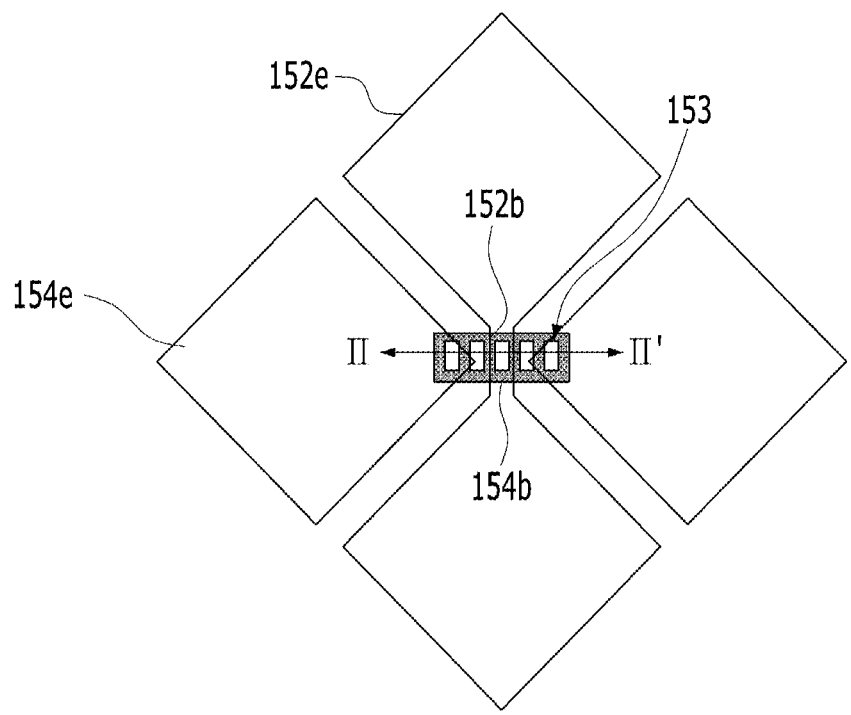
FIG. 9 is a plan view and a sectional view showing another embodiment of a bridge shown in FIGS. 2 and 3.
Figure 9:
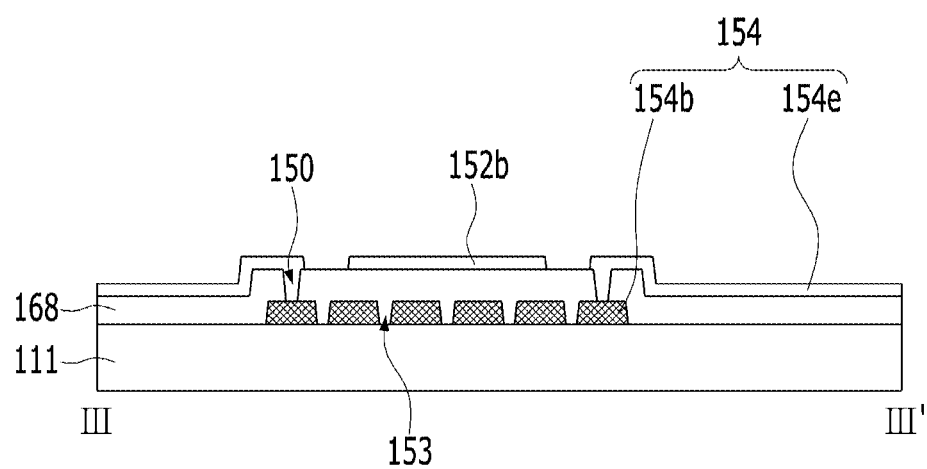

In addition, the second bridge 154b, which is formed of an opaque conductive film and is formed in a different plane than the touch electrodes 152e and 154e, includes a plurality of slits 153, as shown in FIG. 9. The second bridge 154b, which includes a plurality of slits 153, may have a smaller area than a bridge having no slits. Consequently, the reflection of external light due to the second bridge 154b may be reduced, whereby it is possible to prevent the reduction of visibility. The second bridge 154b, which includes a plurality of slits 153, overlaps the bank 128, whereby it is possible to prevent an aperture ratio from being reduced due to the second bridge 154b, which is formed of an opaque conductive film.

Furthermore, in some embodiments of the present invention, the mutual capacitance type touch sensor, which includes the touch-sensing line 154 and the touch-driving line 152, which intersect each other in the state in which the touch dielectric film 168 is disposed therebetween, has been described by way of example. Alternatively, embodiments of the present invention may be applied to a self capacitance type touch sensor. Since self capacitance type touch electrodes have electrically independent self capacitances, the self capacitance type touch electrodes are used as a self capacitance type touch sensor for sensing changes in capacitance due to a user's touch. That is, routing lines connected to the self capacitance type touch electrodes are formed on at least one selected from among the color filter 192, the black matrix 194, and the touch planarization layer 196, included in the color filter array 190, and at least one selected from among the color filter 192, the black matrix 194, and the touch planarization layer 196, included in the color filter array 190, extends to the pad area. Consequently, stress is reduced by the color filter array 190 disposed in the pad area, whereby reliability is improved.

As is apparent from the above description, in the display device according to embodiments of the present invention, the color filter array extends from the active area to the pad area to contact the touch pad. Consequently, stress on the pad area is reduced, whereby reliability is improved. In addition, in embodiments the present invention, it is possible to reduce the height difference between the active area and the pad area, thereby preventing breakage of the routing lines and preventing an increase in resistance. Furthermore, the touch electrodes are disposed on the encapsulation unit, with the result that an additional bonding process is not required, whereby the process is simplified and cost is reduced.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device comprising:
   a light-emitting element disposed on an active area of a substrate;
   an encapsulation unit disposed on the light-emitting element;
   a touch sensor disposed on the encapsulation unit;
   a color filter array disposed between the encapsulation unit and the touch sensor, wherein the color filter array comprises:
   a color filter disposed on the encapsulation unit and a black matrix, and
   wherein the black matrix is disposed on the encapsulation unit;
   a touch pad electrically connected to the touch sensor and disposed on a pad area of the substrate, wherein the touch pad comprises:
   a pad electrode disposed on at least one layer of dielectric film on the substrate; and
   a pad cover electrode connected to the pad electrode and a routing line, and wherein
   the pad cover electrode is connected to the pad electrode exposed through a pad contact hole formed through the color filter array disposed between the pad electrode and the pad cover electrode;
   a dam disposed between the pad area and the active area; and
   the routing line disposed to cross over the dam and overlapping the black matrix included in the color filter array, wherein the routing line is disposed to electrically connect the touch pad and the touch sensor.

2. The display device according to claim 1, further comprising at least one layer of dielectric film disposed between the substrate and the encapsulation unit.

3. The display device according to claim 1, wherein the touch pad is disposed to contact the color filter array.

4. The display device according to claim 1, wherein the color filter array further comprises a planarization layer disposed on the encapsulation unit.

5. The display device according to claim 4, wherein the routing line is disposed to cover at least one of the color filter and the planarization layer, and to contact at least one of the color filter and the planarization layer.

6. The display device according to claim 5, wherein the routing line is disposed to electrically connect the touch pad and the touch sensor to contact at least one of the color filter and the planarization layer.

7. The display device according to claim 1, wherein the pad contact hole is formed through at least one of the color filter and a planarization layer disposed between the pad electrode and the pad cover electrode.

8. The display device according to claim 1, wherein the pad cover electrode contacts at least one of the color filter and the pad electrode contacts the at least one layer of dielectric film.

9. The display device according to claim 1, wherein the encapsulation unit comprises a plurality of inorganic encapsulation layers and at least one organic encapsulation layer disposed between the inorganic encapsulation layers.

10. The display device according to claim 9, wherein the pad contact hole is formed through at least one of the inorganic encapsulation layers disposed between the pad electrode and the pad cover electrode and through at least one of the color filter and a planarization layer.

11. The display device according to claim 9, wherein
at least one of the color filter and a planarization layer extends from the active area to the pad area.

12. The display device according to claim 11, wherein one of the color filter and the planarization layer extends from the active area to an area between the dam and the touch pad, and
wherein other one of the color filter and the planarization layer extends from the active area to the pad area.

13. The display device according to claim 11, wherein the routing line is disposed above the dam in a state in which the color filter array is disposed between the routing line and the dam.

14. The display device according to claim 1, wherein the touch sensor comprises:
touch-driving lines arranged on the color filter array in a first direction; and
touch-sensing lines arranged on the color filter array in a second direction, which intersects the first direction.

15. The display device according to claim 14, wherein the touch-driving lines and the touch-sensing lines are formed in a mesh shape.

16. The display device according to claim 14,
wherein each of the touch-driving lines includes first touch electrodes and first bridges for interconnecting the first touch electrodes,
wherein each of the touch-sensing lines includes second touch electrodes and second bridges for interconnecting the second touch electrodes,
wherein the touch sensor further comprises a dielectric film disposed between the first and second touch electrodes, and
wherein at least one of the first and second bridges comprises at least one slit.

17. The display device according to claim 16, wherein the first and second touch electrodes and the first bridges are formed to have a three-layer stack structure by using at least one conductive layer selected from among Ti, Al, Mo, MoTi, Cu, and Ta.

18. The display device according to claim 16, wherein the second bridges include at least one slit and overlap a bank formed on an anode of the light-emitting element.

19. The display device according to claim 1, further comprising:
a transistor connected to the light-emitting element;
a first dielectric film disposed under an active layer of the transistor;
a second dielectric film disposed between a gate electrode of the transistor and the active layer; and
a third dielectric film disposed between the gate electrode and source and drain electrodes; and
a fourth dielectric film disposed between the source electrode and the drain electrode and the light-emitting element, wherein
at least one layer of dielectric film is at least one of the first to fourth dielectric films.

20. A display device comprising:
a light-emitting element disposed on a substrate;
an encapsulation unit disposed on the light-emitting element;
a touch sensor disposed on the encapsulation unit;
a black matrix disposed on the encapsulation unit;
a routing line overlapping the black matrix;
a color filter disposed between the encapsulation unit and the touch sensor and extending to a pad area on the substrate, wherein the color filter is disposed on the encapsulation unit and the black matrix; and
a touch pad electrically connected to the touch sensor, wherein the touch pad comprises:
a pad electrode disposed on at least one layer of dielectric film on the substrate; and
a pad cover electrode connected to the pad electrode and the routing line, and wherein the pad cover electrode is connected to the pad electrode exposed through a pad contact hole formed through the color filter array disposed between the pad electrode and the pad cover electrode, and
wherein the routing line is disposed to electrically connect the touch pad and the touch sensor.

21. The display device of claim 20, wherein the light-emitting element is formed in an active area, the touch pad is formed in the pad area, and a dam is formed between the active area and the pad area.

* * * * *